(12) United States Patent
Lin et al.

(10) Patent No.: US 12,249,526 B2
(45) Date of Patent: *Mar. 11, 2025

(54) DETECTING DAMAGED SEMICONDUCTOR WAFERS UTILIZING A SEMICONDUCTOR WAFER SORTER TOOL OF AN AUTOMATED MATERIALS HANDLING SYSTEM

(71) Applicant: Taiwan Semiconductor Manufacturing Company, Ltd., Hsinchu (TW)

(72) Inventors: Chen Min Lin, Keelung (TW); Hsien Tse Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/178,772

(22) Filed: Mar. 6, 2023

(65) Prior Publication Data

US 2023/0207357 A1 Jun. 29, 2023

Related U.S. Application Data

(63) Continuation of application No. 16/915,273, filed on Jun. 29, 2020, now Pat. No. 11,600,504.

(51) Int. Cl.
*H01L 21/67* (2006.01)
*G01N 21/88* (2006.01)
(Continued)

(52) U.S. Cl.
CPC ... *H01L 21/67271* (2013.01); *G01N 21/8851* (2013.01); *G01N 21/9503* (2013.01);
(Continued)

(58) Field of Classification Search
CPC ......... H01L 21/67271; H01L 21/67288; H01L 22/12; H01L 21/67294; H01L 22/20;
(Continued)

(56) References Cited

U.S. PATENT DOCUMENTS 5,822,055 A * 10/1998 Tsai ................. G01N 21/95607
250/559.46
5,880,479 A * 3/1999 Wang .................... H01L 21/681
414/757

(Continued)

FOREIGN PATENT DOCUMENTS

CN 1473360 A 2/2004
CN 1503340 A 6/2004
(Continued)

OTHER PUBLICATIONS

Lewis, "HALCON Programming and Engineering Applications," Western Amber Electron and Technology University Press, 2019, 16 pages.

(Continued)

*Primary Examiner* — Mohammed Shamsuzzaman
(74) *Attorney, Agent, or Firm* — Harrity & Harrity, LLP

(57) ABSTRACT

A device may detect a semiconductor wafer to be transferred from a source wafer carrier to a target wafer carrier, and may cause a light source to illuminate the semiconductor wafer. The device may cause a camera to capture images of the semiconductor wafer after the light source illuminates the semiconductor wafer, and may perform image recognition of the images of the semiconductor wafer to determine whether an edge of the semiconductor wafer is damaged. The device may cause the semiconductor wafer to be provided to the source wafer carrier when the edge of the semiconductor wafer is determined to be damaged, and may cause the semiconductor wafer to be provided to the target wafer (Continued)

carrier when the edge of the semiconductor wafer is determined to be undamaged.

20 Claims, 10 Drawing Sheets

(51) Int. Cl.
*G01N 21/95* (2006.01)
*H01L 21/66* (2006.01)

(52) U.S. Cl.
CPC ........ *H01L 21/67288* (2013.01); *H01L 22/12* (2013.01); *G01N 2021/8887* (2013.01)

(58) Field of Classification Search
CPC ........... G01N 21/8851; G01N 21/9503; G01N 2021/8887; B07C 5/02; B07C 5/3422; B07C 5/362; G06T 7/0002; G06T 2207/30148
See application file for complete search history.

(56) References Cited

U.S. PATENT DOCUMENTS

| | | | | | |
|---|---|---|---|---|---|
| 6,097,492 | A | * | 8/2000 | Kondo | ............. H01L 21/67259 250/548 |
| 6,324,298 | B1 | * | 11/2001 | O'Dell | .............. G01N 21/8803 257/E21.53 |
| 6,407,373 | B1 | * | 6/2002 | Dotan | ................ H01L 29/7834 257/E29.267 |
| 6,865,948 | B1 | * | 3/2005 | Chen | .................. G01N 21/9503 73/602 |
| 7,102,743 | B2 | * | 9/2006 | Tsuji | .................. G01N 21/9503 356/237.5 |
| 10,876,975 | B2 | * | 12/2020 | Amanullah | ........ G01N 21/8806 |
| 11,600,504 | B2 | | 3/2023 | Lin et al. | |
| 2002/0125448 | A1 | * | 9/2002 | An | ..................... G01N 21/9501 250/559.3 |
| 2004/0109751 | A1 | * | 6/2004 | Whitcomb | ........ H01L 21/67778 414/744.1 |
| 2005/0168729 | A1 | * | 8/2005 | Jung | .................. G01N 21/9501 356/237.2 |
| 2007/0064224 | A1 | * | 3/2007 | Kreh | .................. G01N 21/9501 356/237.2 |
| 2008/0225281 | A1 | | 9/2008 | Komuro | |
| 2009/0161094 | A1 | * | 6/2009 | Watkins | ................ G06T 7/0004 348/126 |
| 2010/0150429 | A1 | * | 6/2010 | Jau | ......................... G01N 23/04 382/149 |
| 2012/0046904 | A1 | | 2/2012 | Hayashi et al. | |
| 2013/0215258 | A1 | * | 8/2013 | Gaglin | ..................... H04N 7/18 348/87 |
| 2016/0315002 | A1 | | 10/2016 | Komatsu et al. | |
| 2018/0366357 | A1 | * | 12/2018 | Liao | ...................... G06T 7/0008 |
| 2021/0374936 | A1 | | 12/2021 | Koopman et al. | |

FOREIGN PATENT DOCUMENTS

| | | | | |
|---|---|---|---|---|
| CN | 101167171 | A | | 4/2008 |
| CN | 101467023 | A | | 6/2009 |
| CN | 101783306 | A | | 7/2010 |
| CN | 102575993 | A | * | 7/2012 ......... G01N 21/6489 |
| CN | 104634792 | A | | 5/2015 |
| CN | 109427609 | A | | 3/2019 |
| CN | 113333307 | A | * | 9/2021 ......... G01N 21/8851 |
| CN | 214201194 | U | * | 9/2021 |
| DE | 10303459 | A1 | * | 8/2004 ......... G01N 21/9503 |
| DE | 10352936 | A1 | | 12/2004 |
| JP | 2000150624 | A | * | 5/2000 ............ H01L 21/00 |
| JP | 2001118894 | A | | 4/2001 |
| JP | 2007171149 | A | | 7/2007 |
| JP | 2007184529 | A | | 7/2007 |
| JP | 2007189211 | A | * | 7/2007 ............. H01L 21/00 |
| KR | 20080017205 | A | * | 2/2008 ............. H01L 22/12 |
| TW | 200824023 | A | | 6/2008 |
| TW | 201508858 | A | | 3/2015 |
| TW | 201639055 | A | | 11/2016 |
| TW | 201942769 | A | | 11/2019 |
| WO | WO-2004019387 | A1 | * | 3/2004 ............ H01L 21/00 |
| WO | 2011017772 | A1 | | 2/2011 |

OTHER PUBLICATIONS

Taiwanese Office Action issued in Application No. 11021023000, dated Oct. 21, 2021, 8 pages.

Taiwanese Office Action issued in Application No. 11021142880, dated Nov. 22, 2021, 8 pages.

* cited by examiner

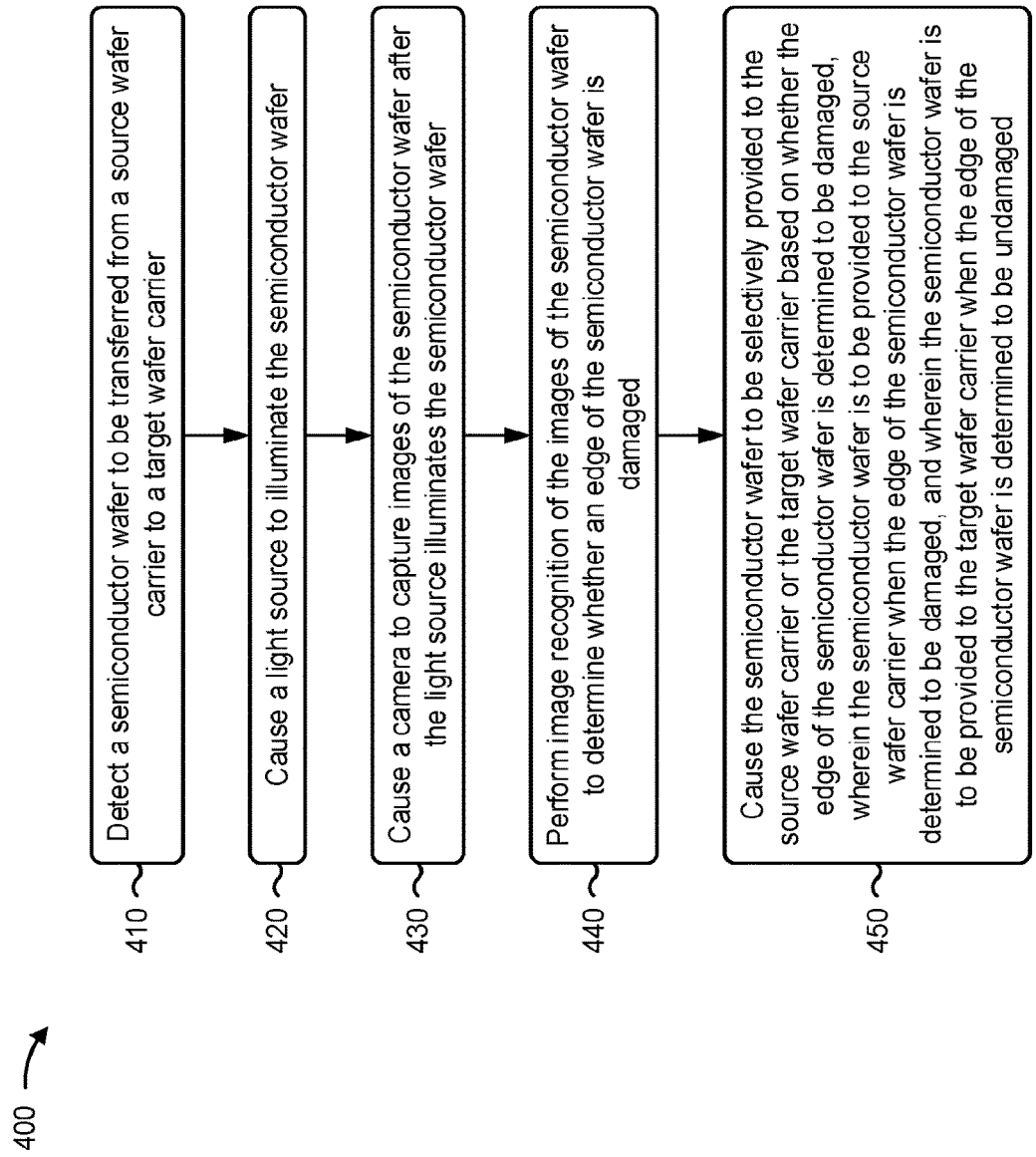

DETECTING DAMAGED SEMICONDUCTOR WAFERS UTILIZING A SEMICONDUCTOR WAFER SORTER TOOL OF AN AUTOMATED MATERIALS HANDLING SYSTEM

RELATED APPLICATION

This application is a continuation of U.S. patent application Ser. No. 16/915,273, filed Jun. 29, 2020 (now U.S. Pat. No. 11,600,504), which is incorporated herein by reference in its entirety.

BACKGROUND

New, fast-paced developments and technological breakthroughs in the semiconductor manufacturing industry increases an importance of optimum utilization of resources. Newer semiconductor wafer fabrication plants emphasize increased yields and reduced cycle times. Automated material handling systems are useful tools that help semiconductor wafer fabrication plants achieve these objectives.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flow chart of an example process for detecting damaged semiconductor wafers utilizing an automated optical inspection tool with a semiconductor wafer sorter tool of an automated materials handling system.

DETAILED DESCRIPTION

Figure 1A:
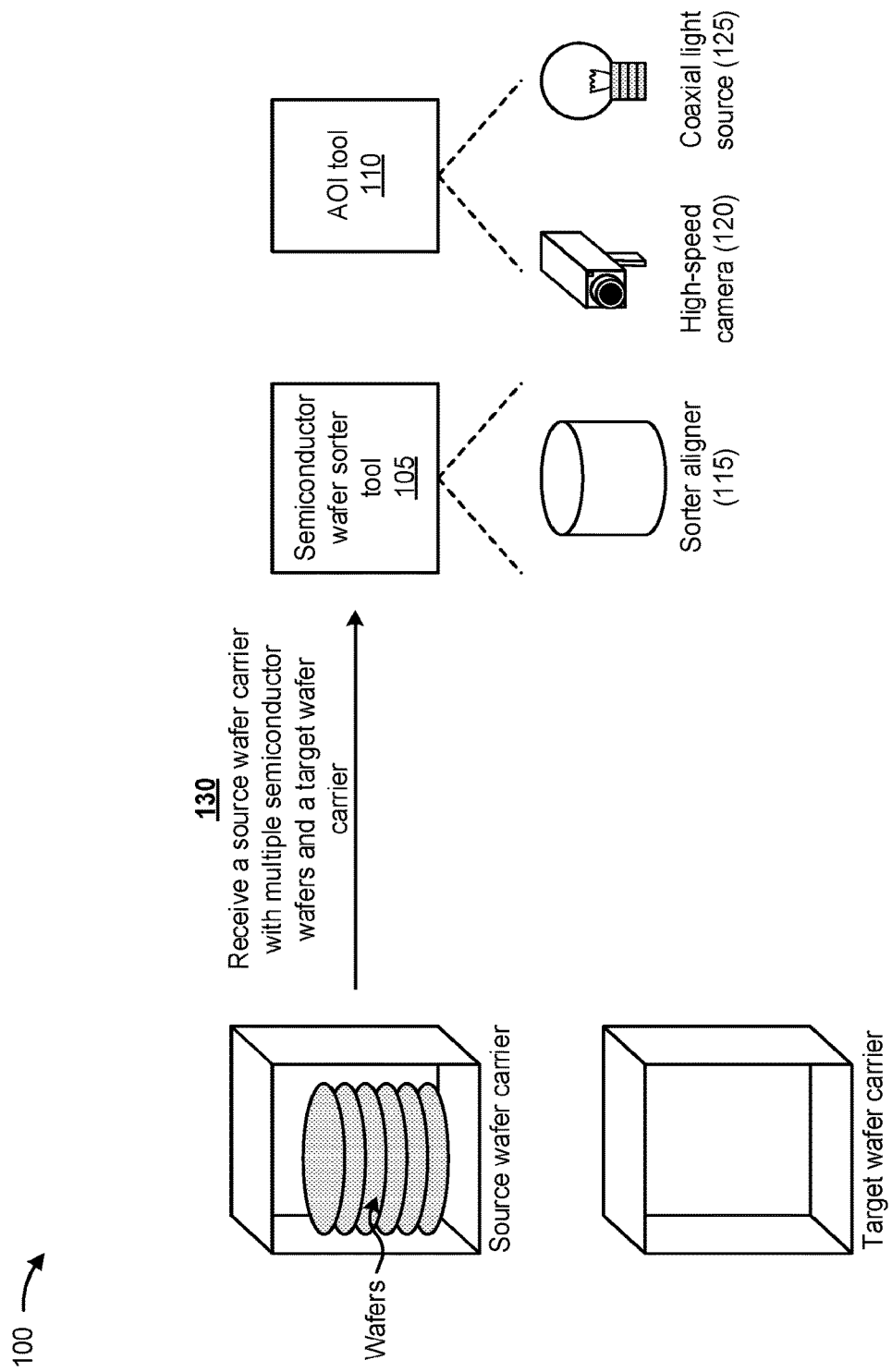
FIGS. 1A-1G are diagrams of one or more example implementations described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, an automated materials handling system is utilized to transport semiconductor wafers, sort semiconductor wafers, and/or the like. The mechanical equipment used in an automated materials handling system includes sorters, conveyors, robotic arms, scanners, semiconductor wafer carriers, and/or the like. One such tool utilized in an automated materials handling system is a semiconductor wafer sorter tool that sorts and transports semiconductor wafers. Semiconductor wafers are susceptible to damage, especially on edges of semiconductor wafers. However, semiconductor wafers are currently inspected for damage by humans before the semiconductor wafers are shipped. Furthermore, current automated materials handling systems only handle and transport semiconductor wafers and do not inspect the semiconductor wafers for damage. This results in a time-consuming, tedious, and error-prone process for detecting damaged semiconductor wafers that wastes resources (e.g., human resources, tool resources, manufacturing resources, and/or the like) and creates an inflexible production requirement.

According to some implementations described herein, an automated optical inspection tool may be utilized with a semiconductor wafer sorter tool of an automated materials handling system to automatically detect damaged semiconductor wafers while the semiconductor wafers are being handled by the semiconductor wafer sorter tool. For example, the automated optical inspection tool may detect a semiconductor wafer to be transferred from a source wafer carrier to a target wafer carrier, and may cause a light source to illuminate the semiconductor wafer. The automated optical inspection tool may cause a camera to capture images of the semiconductor wafer after the light source illuminates the semiconductor wafer, and may perform image recognition of the images of the semiconductor wafer to determine whether an edge of the semiconductor wafer is damaged. The automated optical inspection tool may cause the semiconductor wafer to be selectively provided to the source wafer carrier or the target wafer carrier based on whether the edge of the semiconductor wafer is determined to be damaged. The semiconductor wafer may be provided to the source wafer carrier when the edge of the semiconductor wafer is determined to be damaged, and may be provided to the target wafer carrier when the edge of the semiconductor wafer is determined to be undamaged.

In this way, the automated optical inspection tool may be utilized with the semiconductor wafer sorter tool of the automated materials handling system to automatically detect damaged semiconductor wafers while the semiconductor wafers are being handled by the system. For example, the automated optical inspection tool may capture images of the semiconductor wafers and may perform image recognition of the captured images to identify damaged semiconductor wafers. Thus, the automated optical inspection tool may identify damaged semiconductor wafers prior to the semiconductor wafers being provided for shipping, may increase throughput of semiconductor wafer production, may conserve resources (e.g., human resources, tool resources, and/or manufacturing resources), and/or the like.

FIGS. 1A-1G are diagrams 100 of one or more example implementations described herein. As shown in FIG. 1A, a source wafer carrier (e.g., with multiple semiconductor wafers) and a target wafer carrier (e.g., without any semiconductor wafers) may be associated with a semiconductor wafer sorter tool 105, an automated optical inspection (AOI) tool 110, a sorter aligner 115 of semiconductor wafer sorter tool 105, a high-speed camera 120 of AOI tool 110, and a coaxial light source 125 of AOI tool 110.

Semiconductor wafer sorter tool 105 may include an automated materials handling system tool that sorts and transports semiconductor wafers. For example, semiconductor wafer sorter tool 105 may automatically sort semiconductor wafers, divide semiconductor wafers into groups, transfer semiconductor wafers from a source wafer carrier to a target wafer carrier, transfer semiconductor wafers from a target wafer carrier to a source wafer carrier, transfer semiconductor wafers to other tools of the automated materials handling system, and/or the like. In some implementations, once the semiconductor wafers are sorted (e.g., between source wafer carrier and target wafer carrier), semiconductor wafer sorter tool 105 causes the source wafer carrier and the target wafer carrier to be provided to other locations of a manufacturing facility. For example, semiconductor wafer sorter tool 105 may cause the source wafer carrier and/or the target wafer carrier (e.g., with damaged semiconductor wafers) to be provided for quality control inspection, may cause the source wafer carrier and/or the target wafer carrier (e.g., with undamaged semiconductor wafers) to be provided to other tools for further processing, may cause the source wafer carrier and/or the target wafer carrier (e.g., with undamaged semiconductor wafers) to be prepared for shipping, and/or the like.

Semiconductor wafer sorter tool 105 may transfer semiconductor wafers to different wafer carriers (e.g., different target wafer carriers) since different wafer carriers may be designated for different semiconductor processes, shipments, testing processes, and/or the like. For example, semiconductor wafer sorter tool 105 may provide a semiconductor wafer to be diced to a corresponding wafer carrier designated for a dicing operation. In some implementations, a semiconductor wafer includes identification data (e.g., a numeric code, an alphanumeric code, a bar code, a QR code, and/or the like) on a top surface and/or a bottom surface of the semiconductor wafer, and semiconductor wafer sorter tool 105 may identify the semiconductor wafer based on the identification data.

In some implementations, semiconductor wafer sorter tool 105 may utilize sorter aligner 115 to identify a notch or a flat of the semiconductor wafer. A semiconductor wafer with a diameter of less than two-hundred (200) millimeters has a flat cut into one side. The flat allows for a precise alignment of the semiconductor wafer for handling by semiconductor wafer sorter tool 105 (e.g., by robotic components of semiconductor wafer sorter tool 105). A semiconductor wafer with a diameter greater than or equal to two-hundred (200) millimeters uses a notch instead of a flat. The notch on the edge of the semiconductor wafer also allows for a precise alignment of the semiconductor wafer, but takes up much less wafer surface. In some implementations, sorter aligner 115 includes a rotatable chuck that rotates the semiconductor wafer. In order to align the semiconductor wafer, sorter aligner 115 may perform a pre-alignment that includes centering a center position of the rotatable chuck of sorer aligner 115 with a center position of the semiconductor wafer. After the pre-alignment, sorter aligner 115 may perform an alignment that includes causing the rotatable chuck to rotate the semiconductor wafer in order to identify (e.g., align) the flat or the notch of the semiconductor wafer (e.g., using a detection method of a charge coupled device (CCD) sensor). After the alignment, sorter aligner 115 may cause the rotatable chuck to rotate the semiconductor wafer again to re-check for the flat or the notch of the semiconductor wafer.

AOI tool 110 may include a tool that provides an automated visual inspection of a semiconductor wafer where a camera autonomously scans the semiconductor wafer under test for catastrophic failure (e.g., a missing component), quality defects (e.g., a damaged edge of the semiconductor wafer), and/or the like. Thus, AOI tool 110 provides a non-contact test method for semiconductor wafers. AOI tool 110 may include high-speed camera 120 and coaxial light source 125. High-speed camera 120 may include a camera that captures at least sixty frames of images per second. In some implementations, high-speed camera 120 may include a camera that captures at least two hundred and fifty frames of images per second. High-speed camera 120 may include a resolution of 0.3 megapixel, one megapixel, two megapixel, and/or the like. High-speed camera 120 may capture images of a semiconductor wafer positioned on sorter aligner 115. In some implementations, a camera of AOI tool 110 may be a high-speed camera since sorter aligner 115 rotates the semiconductor wafer and a high-speed camera may be useful to accurately capture images of the rotating semiconductor wafer. High-speed camera 120 may be positioned above the semiconductor wafer at a distance so that high-speed camera 120 captures the entire semiconductor wafer in a single frame, at a distance so that high-speed camera 120 captures a portion (e.g., a percentage) of the semiconductor in a single frame, and/or the like. In some implementations, high-speed camera 120 may be positioned directly above the semiconductor wafer, at an angle relative to a top surface of the semiconductor wafer to reduce reflection of light from coaxial light source 125, and/or the like. In some implementations, if coaxial light source 125 is not utilized or is positioned below the semiconductor wafer, high-speed camera 125 may be positioned directly below the semiconductor wafer, at an angle relative to a bottom surface of the semiconductor wafer, and/or the like.

Coaxial light source 125 may provide a diffuse illumination of a sheet of light from a position above (e.g., directly above or at an angle to) the top surface a semiconductor wafer (e.g., positioned on sorter aligner 115). In some implementations, coaxial light source 125 may be positioned below (e.g., directly below or at an angle to) the bottom surface of the semiconductor wafer. In such implementations where coaxial light source 125 is positioned below the bottom surface of the semiconductor wafer, high-speed camera 120 may also be positioned below the bottom surface of the semiconductor wafer. In some implementations, coaxial light source 125 may be utilized since a surface of a semiconductor wafer has a high degree of reflectivity, and coaxial light is useful for such a surface. In some implementations, coaxial light source 125 may be replaced with a light source that illuminates the semiconductor wafer from a position above the semiconductor wafer. In some implementations, high-speed camera 120 may be capable of capturing images without use of a dedicated light source, such as coaxial light source 125. In such implementations, high-speed camera 120 may be positioned above or below the semiconductor wafer.

As further shown in FIG. 1A, and by reference number 130, semiconductor wafer sorter tool 105 may receive the source wafer carrier with the multiple semiconductor wafers and the target wafer carrier. For example, semiconductor wafer sorter tool 105 may receive the source wafer carrier and/or the target wafer carrier from one or more automated materials handling system tools (e.g., robots, conveyors, and/or the like). In some implementations, semiconductor wafer sorter tool 105 retrieves (e.g., with a robotic arm) a semiconductor wafer from the source wafer carrier.

Figure 1B:
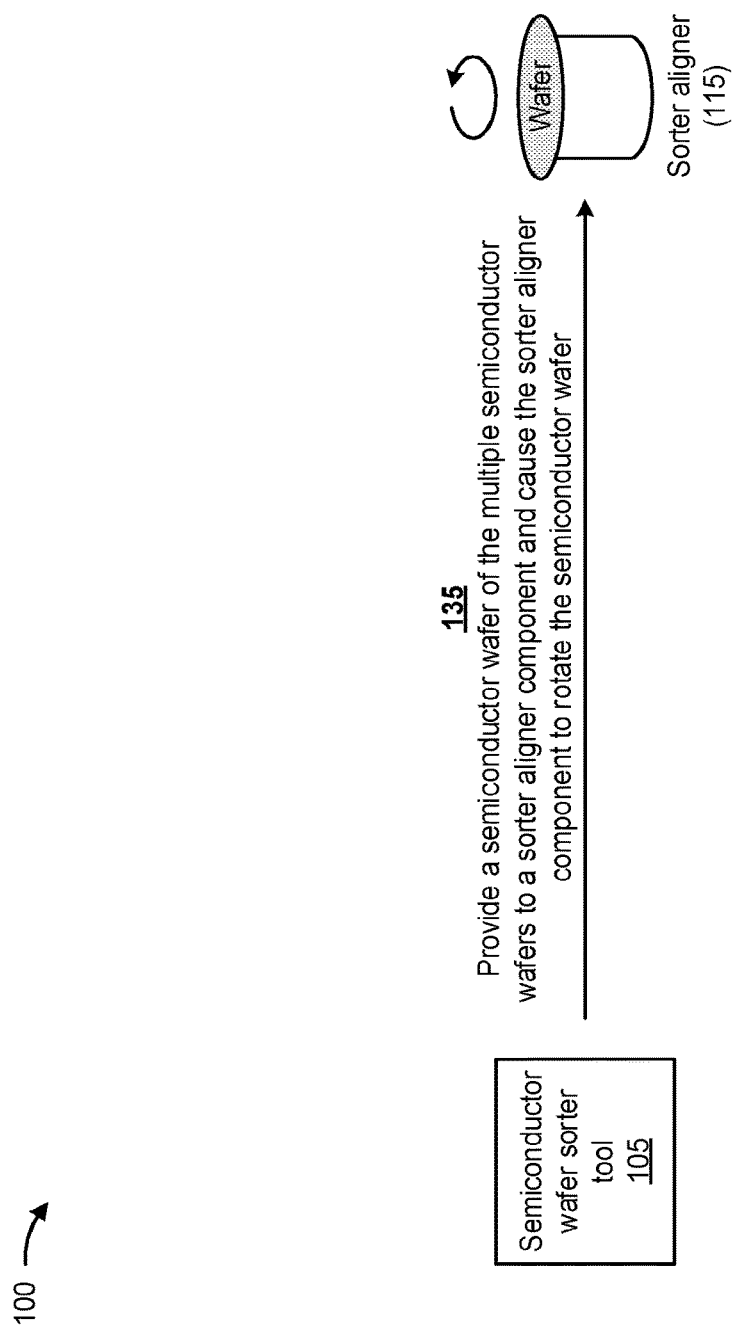

As shown in FIG. 1B, and by reference number 135, semiconductor wafer sorter tool 105 may provide a semiconductor wafer of the multiple semiconductor wafers (e.g., obtained from the source wafer carrier) to sorter aligner 115. For example, semiconductor wafer sorter tool 105 may obtain the semiconductor wafer from the source wafer carrier and may provide the semiconductor wafer on the rotatable chuck of sorter aligner 115. The rotatable chuck may be sized and shaped to receive and retain the semiconductor wafer. The rotatable chuck may include a vacuum that retains the semiconductor wafer on the surface of the rotatable chuck, may include a surface friction that retains the semiconductor wafer on the surface of the rotatable chuck, and/or the like.

As further shown in FIG. 1B, and by reference number 135, semiconductor wafer sorter tool 105 may cause sorter aligner 115 to rotate the semiconductor wafer. For example, the rotatable chuck of sorter aligner 115 may rotate and the vacuum, the surface friction, and/or the like retaining the semiconductor wafer on the rotatable chuck may cause the semiconductor wafer to rotate with the rotatable chuck. In some implementations, sorter aligner 115 may rotate the semiconductor wafer at a speed of two revolutions per second, three revolutions per second, and/or the like. In some implementations, AOI tool 110 is integrated with sorter aligner 115 so that AOI tool 110 may inspect the semiconductor wafer as sorter aligner 115 rotates the semiconductor wafer.

Figure 1C:
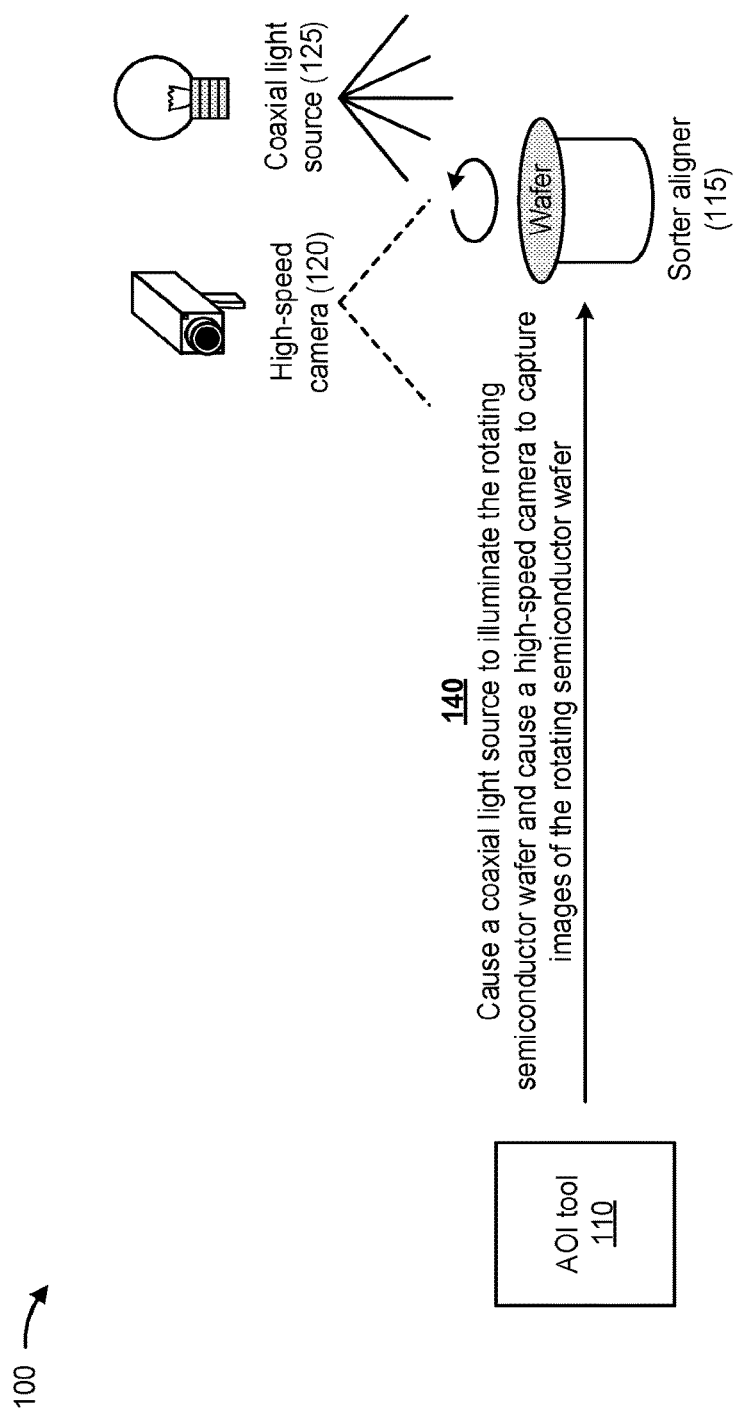

As shown in FIG. 1C, and by reference number 140, AOI tool 110 may cause coaxial light source 125 to illuminate the semiconductor wafer, as the semiconductor wafer is rotated by sorter aligner 115. For example, AOI tool 110 may receive a first signal indicating that sorter aligner 115 is rotating or is about to rotate the semiconductor wafer, and may provide, to coaxial light source 125 and based on the first signal, a second signal instructing coaxial light source 125 to energize and illuminate the semiconductor wafer. In some implementations, coaxial light source 125 may provide a diffuse illumination of a sheet of light from a position above the semiconductor wafer (e.g., rotating on sorter aligner 115) so that images may be captured by high-speed camera 120.

As further shown in FIG. 1C, and by reference number 140, AOI tool 110 may cause high-speed camera 120 to capture images of the semiconductor wafer after coaxial light source 125 illuminates the semiconductor wafer. For example, AOI tool 110 may receive a first signal indicating that sorter aligner 115 is rotating or is about to rotate the semiconductor wafer, and may provide, to high-speed camera 120 and based on the first signal, a second signal instructing high-speed camera 120 to energize and capture images of the semiconductor wafer. In some implementations, high-speed camera 120 captures at least sixty frames, at least one-hundred and twenty frames, at least two-hundred and forty frames, and/or the like of the images of the semiconductor wafer per second. In some implementations, high-speed camera 120 captures images of the semiconductor wafer until sorter aligner 115 rotates the semiconductor wafer at least one revolution. For example, if sorter aligner 115 rotates the semiconductor wafer two revolutions per second, then high-speed camera 120 may capture images of the semiconductor wafer on or after 0.5 seconds, on or after one second, and/or the like. AOI tool 110 may instruct high-speed camera 120 when to capture images of the semiconductor wafer and when to cease capturing images of the semiconductor wafer.

Figure 1D:
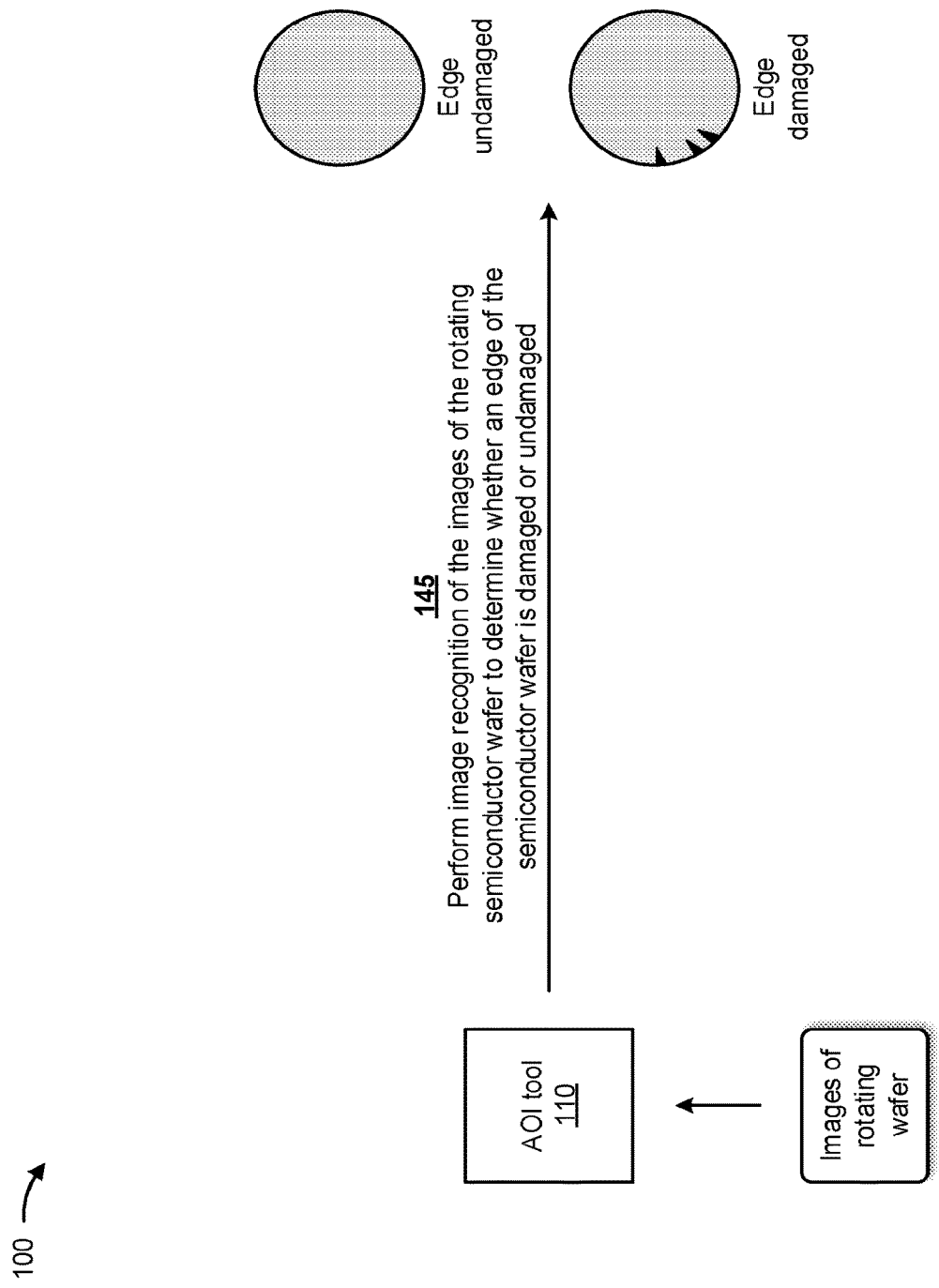

As shown in FIG. 1D, and by reference number 145, AOI tool 110 may perform image recognition of the images of the semiconductor wafer (e.g., captured by high-speed camera 120) to determine whether an edge of the semiconductor wafer is damaged. For example, AOI tool 110 may process the images of the semiconductor wafer, with an image recognition model, to determine whether an edge of the semiconductor wafer is damaged (e.g., includes one or more missing portions). In some implementations, the image recognition model includes a convolutional neural network model, a classification model, a support vector machine model, and/or like that is trained with historical image data identifying semiconductor wafers with damaged edges, semiconductor wafers with undamaged edges, and/or the like. For example, the convolutional neural network model may be trained with performing feature extraction and classification. In another example, features of the images may be manually extracted and the features may be utilized to train the support vector machine model. In still another example, the classification layers of the convolutional neural network model may be skipped and features extracted from different neural network layers may be utilized to train the support vector machine model.

In some implementations, AOI tool 110 may train the image recognition model with historical data (e.g., historical data identifying semiconductor wafers with damaged edges, semiconductor wafers with undamaged edges, and/or the like) to generate a trained image recognition model capable of determining whether an edge of a semiconductor wafer is damaged. AOI tool 110 may separate the historical data into a training set, a validation set, a test set, and/or the like. The training set may be utilized to train the image recognition model. The validation set may be utilized to validate results of the trained image recognition model. The test set may be utilized to test operation of the trained image recognition model.

In some implementations, AOI tool 110 may train the image recognition model using, for example, an unsupervised training procedure and based on the historical data. For example, AOI tool 110 may perform dimensionality reduction to reduce the historical data to a minimum feature set, thereby reducing resources (e.g., processing resources, memory resources, and/or the like) to train the image recognition model, and may apply a classification technique to the minimum feature set.

In some implementations, AOI tool 110 may use a logistic regression classification technique to determine a categorical outcome (e.g., whether an edge of a semiconductor wafer is damaged). Additionally, or alternatively, AOI tool 110 may use a naive Bayesian classifier technique. In this case, AOI tool 110 may perform binary recursive partitioning to split the historical data into partitions and/or branches, and use the partitions and/or branches to determine outcomes (e.g., whether an edge of a semiconductor wafer is damaged). Based on using recursive partitioning, AOI tool 110 may reduce utilization of computing resources relative to manual, linear sorting and analysis of data points, thereby enabling use of thousands, millions, or billions of data points to train the image recognition model, which may result in more accurate models than using fewer data points.

Additionally, or alternatively, AOI tool 110 may use a support vector machine (SVM) classifier technique to generate a non-linear boundary between data points in the training set. In this case, the non-linear boundary is used to classify test data into a particular class.

Additionally, or alternatively, AOI tool 110 may train the image recognition model using a supervised training procedure that includes receiving input to the image recognition model from a subject matter expert, which may reduce an amount of time, an amount of processing resources, and/or the like to train the image recognition model relative to an unsupervised training procedure.

In some implementations, AOI tool 110 may use one or more other model training techniques, such as a latent semantic indexing technique, and/or the like. For example, AOI tool 110 may perform an artificial neural network processing technique (e.g., using a two-layer feedforward neural network architecture, a three-layer feedforward neural network architecture, and/or the like) to perform pattern recognition with regard to patterns of the historical data. In this case, using the artificial neural network processing technique may improve an accuracy of the trained image recognition model generated by AOI tool 110 by making the model more robust to noisy, imprecise, or incomplete data, and by enabling AOI tool 110 to detect patterns and/or trends undetectable to human analysts or systems using less complex techniques.

In some implementations, rather than training the image recognition model, AOI tool 110 may obtain the trained image recognition model from another system or device that trained the image recognition model to generate the trained image recognition model. In this case, AOI tool 110 may provide the other system or device with the historical data for use in training the image recognition model, and may provide the other system or device with updated historical data to retrain the image recognition model in order to update the trained image recognition model.

In some implementations, AOI tool 110 may perform the image recognition of the images of the semiconductor wafer to determine whether the edge of the semiconductor wafer is damaged while the semiconductor wafer is being transported from the source wafer carrier, while the semiconductor wafer is being sorted, while the semiconductor wafer is being rotated by sorter aligner 115, and/or the like. AOI tool 110 may perform the image recognition of the images of the semiconductor wafer to determine, in real time or in near-real time (e.g., less than two to three seconds), whether the edge of the semiconductor wafer is damaged. When performing the image recognition of the images of the semiconductor wafer, AOI tool 110 may determine (e.g., via the image recognition) that one or more portions of the edge of the semiconductor wafer are missing when the captured images of the semiconductor wafer include images that are darker in color than a color of surface of the semiconductor wafer. For example, the semiconductor wafer may include a first color (e.g., grey or white) and missing portions (e.g., chipped edges) of the semiconductor wafer may include a second color (e.g., black) that is different from the first color. AOI tool 110 may determine that the edge of the semiconductor wafer is damaged when a quantity of the one or more portions satisfies a threshold quantity of portions (e.g., one portion, two portions, three portions, and/or the like).

When performing the image recognition of the images of the semiconductor wafer, AOI tool 110 may determine that one or more portions of the edge of the semiconductor wafer are missing, and may calculate one or more approximate sizes (e.g., lengths, widths, areas, and/or the like) associated with the one or more portions of the edge of the semiconductor wafer. For example, if the missing portions include the second color as described above, AOI tool 110 may calculate approximate sizes of the missing portions by approximating areas of n-sided irregular polygons representing the missing portions (e.g., via coordinate geometry, a model to determine an area of any polygon, and/or the like). AOI tool 110 may determine that the edge of the semiconductor wafer is damaged when at least one size, of the one or more sizes associated with the one or more portions, satisfies a threshold size (e.g., a particular length, a particular width, a particular area, and/or the like). When performing the image recognition of the images of the semiconductor wafer, AOI tool 110 may determine that one or more portions of the edge of the semiconductor wafer are missing, may calculate one or more sizes associated with the one or more portions of the edge of the semiconductor wafer, and may determine that the edge of the semiconductor wafer is damaged when a quantity of the one or more portions satisfies a threshold quantity of portions and/or when at least one size, of the one or more sizes associated with the one or more portions, satisfies a threshold size.

As further shown in FIG. 1D, the semiconductor wafer may include a circular-shaped wafer and the edge of the semiconductor wafer may include a perimeter of the circular-shaped wafer. Thus, a semiconductor wafer with a damaged edge is missing one or more portions (e.g., and/or with one or more sizes, shown in black) of the perimeter of the circular-shaped wafer, and a semiconductor wafer with an undamaged edge is not missing any portions of the perimeter of the circular-shaped wafer, is not missing more than the threshold quantity of portions, is not missing at least one size that satisfies a threshold size, and/or the like.

Figure 1E:
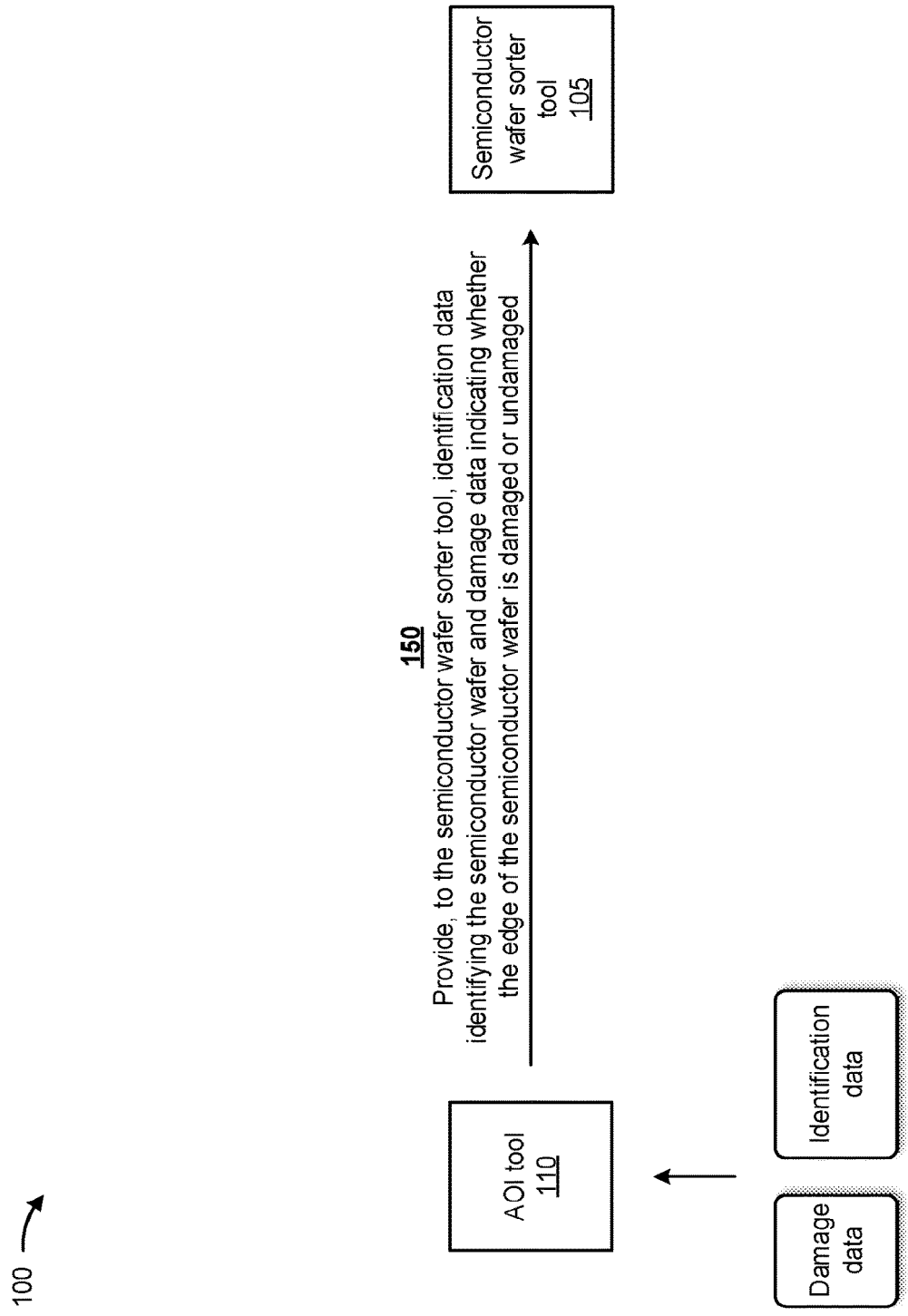

As shown in FIG. 1E, and by reference number 150, AOI tool 110 may provide, to semiconductor wafer sorter tool 105, identification data identifying the semiconductor wafer and damage data indicating whether the edge of the semiconductor wafer is damaged or undamaged. For example, AOI 110 may capture the identification data identifying the semiconductor wafer (e.g., the numeric code, the alphanumeric code, the bar code, the QR code, and/or the like) on the top surface (e.g., when high-speed camera 120 is located above the semiconductor wafer) and/or the bottom surface (e.g., when high-speed camera 120 is located below the semiconductor wafer) of the semiconductor wafer during performance of the image recognition, and may provide the identification data to semiconductor wafer sorter tool 105. Alternatively, or additionally, sorter aligner 115 may determine the identification data and may provide the identification data to semiconductor wafer sorter tool 105. AOI tool 110 may determine the damage data based on performance of the image recognition, and may provide the damage data to semiconductor wafer sorter tool 105.

Figure 1F:
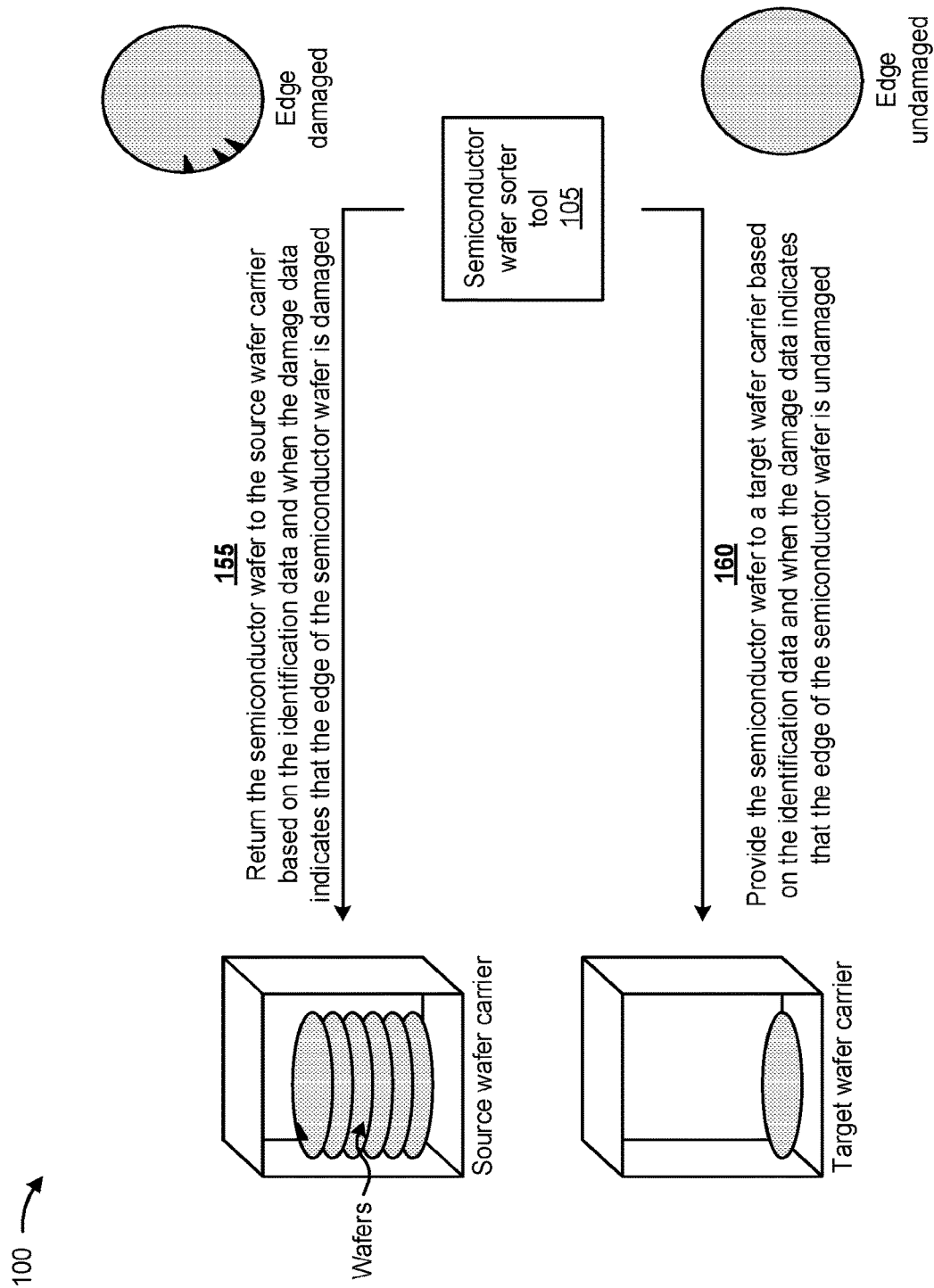

As shown in FIG. 1F, and by reference number 155, semiconductor wafer sorter tool 105 may return the semiconductor wafer to the source wafer carrier based on the identification data and when the damage data indicates that the edge of the semiconductor wafer is damaged. For example, semiconductor wafer sorter tool 105 may cause sorter aligner 115 and the semiconductor wafer to stop rotating, and may utilize robotics to remove the semiconductor wafer from sorter aligner 115. Semiconductor wafer sorter tool 105 may utilize robotics to transport the semiconductor wafer from sorter aligner to the source wafer carrier, and may utilize robotics to place the semiconductor wafer in the source wafer carrier. If the semiconductor wafer is determined to be damaged, the semiconductor wafer may not be provided to the target wafer carrier since the target wafer carrier may be designated for undamaged semiconductor wafers that require further processing, shipment, and/or the like. Furthermore, damaged semiconductor wafers may be returned to the source wafer carrier since the source wafer carrier may be designated for semiconductor wafers that require quality control testing. Thus, semiconductor wafer sorter tool 105 may return the damaged semiconductor wafer to the source wafer carrier. In some implementations, semiconductor wafer sorter tool 105 may provide the semiconductor wafer to the target wafer carrier (instead of the source wafer carrier) based on the identification data and when the damage data indicates that the edge of the semiconductor wafer is damaged.

As further shown in FIG. 1F, and by reference number 160, semiconductor wafer sorter tool 105 may provide the semiconductor wafer to the target wafer carrier based on the identification data and when the damage data indicates that the edge of the semiconductor wafer is undamaged (e.g., in a similar manner as described above for provision of the semiconductor wafer to the source wafer carrier). For example, the semiconductor wafer may be provided to the target wafer carrier since the target wafer carrier may be designated for undamaged semiconductor wafers that require further processing, shipment, and/or the like. Thus, semiconductor wafer sorter tool 105 may return the undamaged semiconductor wafer to the target wafer carrier. In some implementations, semiconductor wafer sorter tool 105 may provide the semiconductor wafer to the source wafer carrier (instead of the target wafer carrier) based on the identification data and when the damage data indicates that the edge of the semiconductor wafer is undamaged.

Figure 1G:
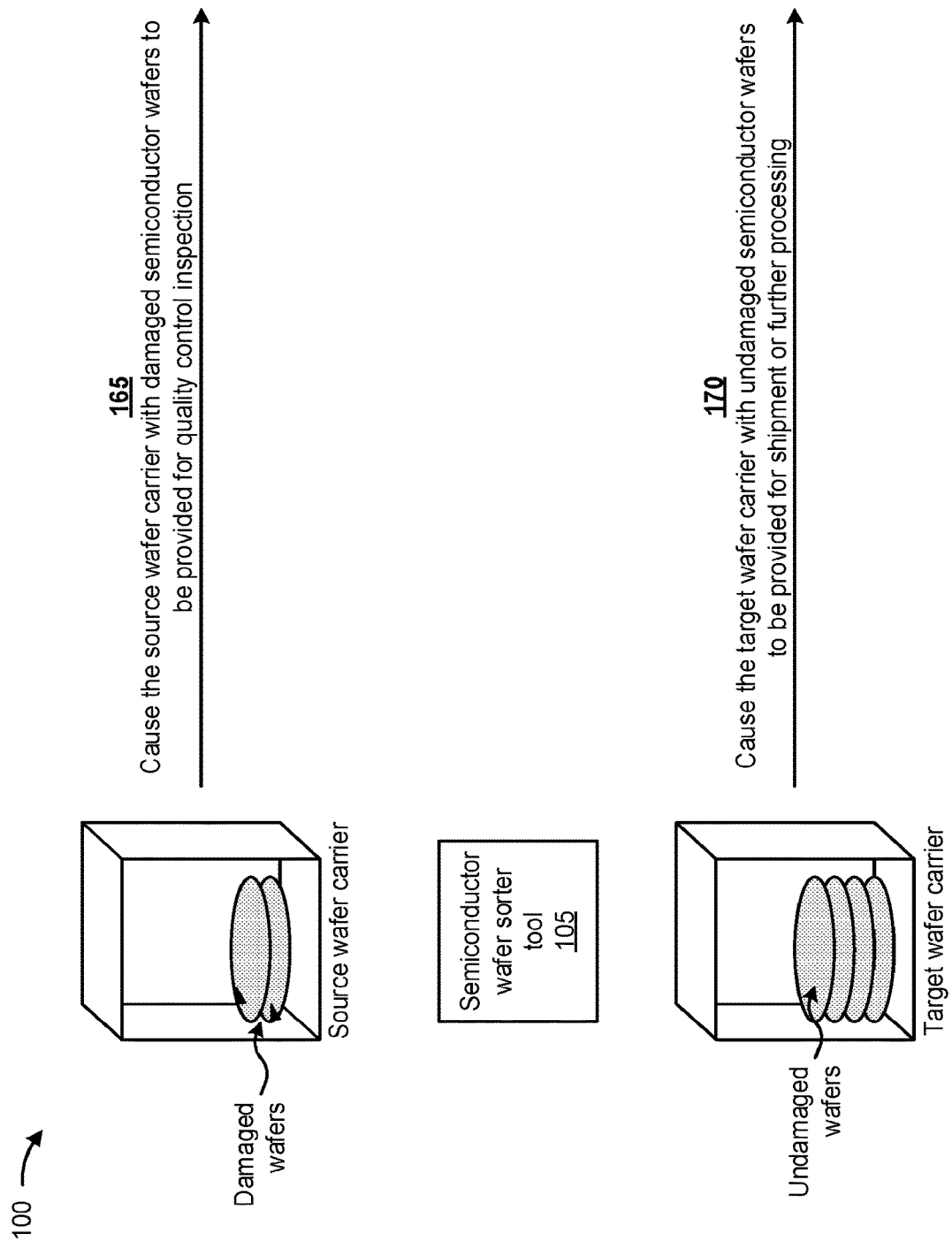

As shown in FIG. 1G, and by reference number 165, semiconductor wafer sorter tool 105 may cause the source wafer carrier with one or more damaged semiconductor wafers to be provided for quality control inspection. For example, semiconductor wafer sorter tool 105 may cause the source wafer carrier to be provided to an automated materials handling system that transports the source wafer carrier to a location associated with the quality control inspection of damaged semiconductor wafers. In some implementations, semiconductor wafer sorter tool 105 may provide at least one of the images of the semiconductor wafer for display (e.g., to a user of semiconductor wafer sorter tool 105 and/or a user of AOI tool 110), for storage in a storage device for later analysis, and/or the like when the edge of the semiconductor wafer is determined to be damaged.

As further shown in FIG. 1G, and by reference number 170, semiconductor wafer sorter tool 105 may cause the target wafer carrier with one or more undamaged semiconductor wafers to be provided for shipment, further processing, and/or the like. For example, semiconductor wafer sorter tool 105 may cause the target wafer carrier to be provided to an automated materials handling system that transports the target wafer carrier to a location associated with shipment of undamaged semiconductor wafers, to a location associated with further processing of undamaged semiconductor wafers, and/or the like.

In this way, AOI tool 110 may be utilized with semiconductor wafer sorter tool 105 to automatically determine whether semiconductor wafers are damaged or undamaged while the semiconductor wafers are being handled by semiconductor wafer sorter tool 105. For example, AOI tool 110 may capture images of a semiconductor wafer while the semiconductor wafer is being rotated by sorter aligner 115 of semiconductor wafer sorter tool 105. AOI tool 110 may perform image recognition of the captured images to determine whether the semiconductor wafer is damaged. If the semiconductor wafer is damaged, the semiconductor wafer may be transported to quality control inspection to determine whether the semiconductor wafer may be salvaged. If the semiconductor wafer is undamaged, the semiconductor wafer may be transported for further processing. Thus, AOI tool 110 may identify damaged semiconductor wafers prior to the semiconductor wafers being provided for shipping, may increase throughput of semiconductor wafer production, may conserve resources (e.g., human resources, tool resources, and/or manufacturing resources), and/or the like.

As indicated above, FIGS. 1A-1G are provided merely as examples. Other examples may differ from what was described with regard to FIGS. 1A-1G. The number and arrangement of devices and/or components shown in FIGS. 1A-1G are provided as an example. In practice, there may be additional devices and/or components, fewer devices and/or components, different devices and/or components, or differently arranged devices and/or components than those shown in FIGS. 1A-1G. Furthermore, two or more devices shown in FIGS. 1A-1G may be implemented within a single device, or a single device shown in FIGS. 1A-1G may be implemented as multiple, distributed devices. Additionally, or alternatively, a set of devices (e.g., one or more devices) of FIGS. 1A-1G may perform one or more functions described as being performed by another set of devices of FIGS. 1A-1G.

Figure 2:
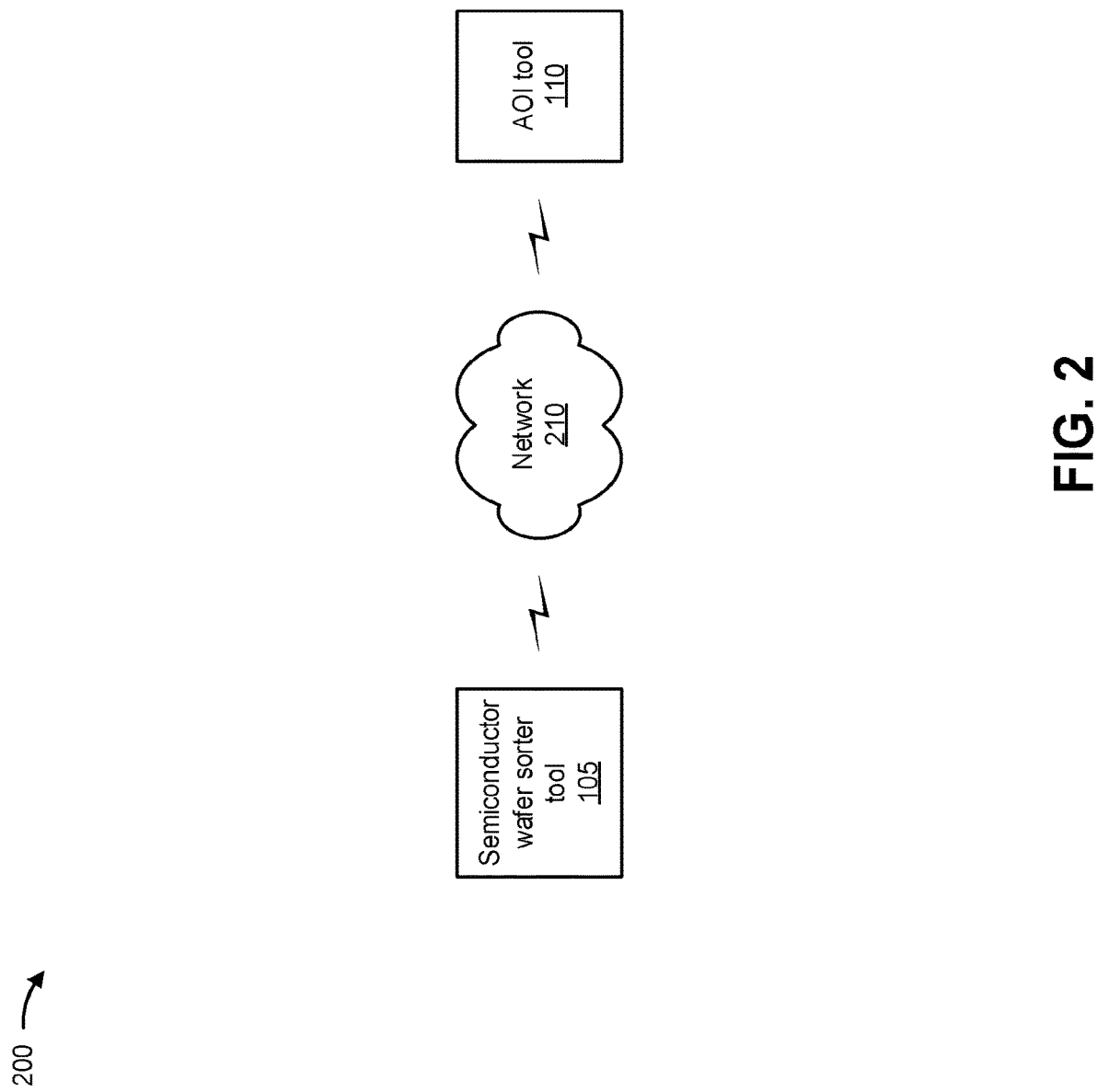
FIG. 2 is a diagram of an example environment in which systems and/or methods described herein may be implemented.

FIG. 2 is a diagram of an example environment 200 in which systems and/or methods described herein may be implemented. As shown in FIG. 2, example environment 200 may include semiconductor wafer sorter tool 105, AOI tool 110, and a network 210. Devices and/or networks of example environment 200 may interconnect via wired connections, wireless connections, or a combination of wired and wireless connections.

Semiconductor wafer sorter tool 105 includes a tool that sorts and transports semiconductor wafers. For example, semiconductor wafer sorter tool 105 may automatically sort, divide, and/or transfer semiconductor wafers from any wafer carrier (e.g., a plastic transport wafer carrier, a plastic process wafer carrier, a metal transport wafer carrier, a metal process wafer carrier) to any other wafer carrier regardless of a quantity of slots in the wafer carriers. In some implementations, semiconductor wafer sorter tool 105 communicates with AOI tool 110 via network 210, includes AOI tool 110 as a component, and/or the like. Further details of semiconductor wafer sorter tool 105 and sorter aligner 115 are provided above in connection with one or more of FIGS. 1A-1G.

AOI tool 110 includes a tool that provides an automated visual inspection of a semiconductor wafer where a camera (e.g., high-speed camera 120 that captures at least sixty (60) frames of images per second) autonomously scans the semiconductor wafer under test for catastrophic failure (e.g., a missing component), quality defects (e.g., a damaged edge of the semiconductor wafer), and/or the like. In some implementations, AOI tool 110 includes a light source (e.g., coaxial light source 125) that provides a diffuse illumination of a sheet of light from a position above a semiconductor wafer while the camera captures images of the semiconductor wafer. In some implementations, AOI tool 110 performs image recognition of the images of the semiconductor wafer captured by the camera to determine whether an edge of the semiconductor wafer is damaged. In some implementations, AOI tool communicates with semiconductor wafer sorter tool 105 via network 210, is included as a component of semiconductor wafer sorter tool 105, and/or the like. Further details of AOI tool 110, high-speed camera 120, coaxial light source 125 are provided above in connection with one or more of FIGS. 1A-1G.

Network 210 includes one or more wired and/or wireless networks. For example, network 210 may include a local area network (LAN), a wide area network (WAN), a metropolitan area network (MAN), a private network, an ad hoc network, an intranet, the Internet, a fiber optic-based network, and/or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of example environment 200 may perform one or more functions described as being performed by another set of devices of example environment 200.

Figure 3:
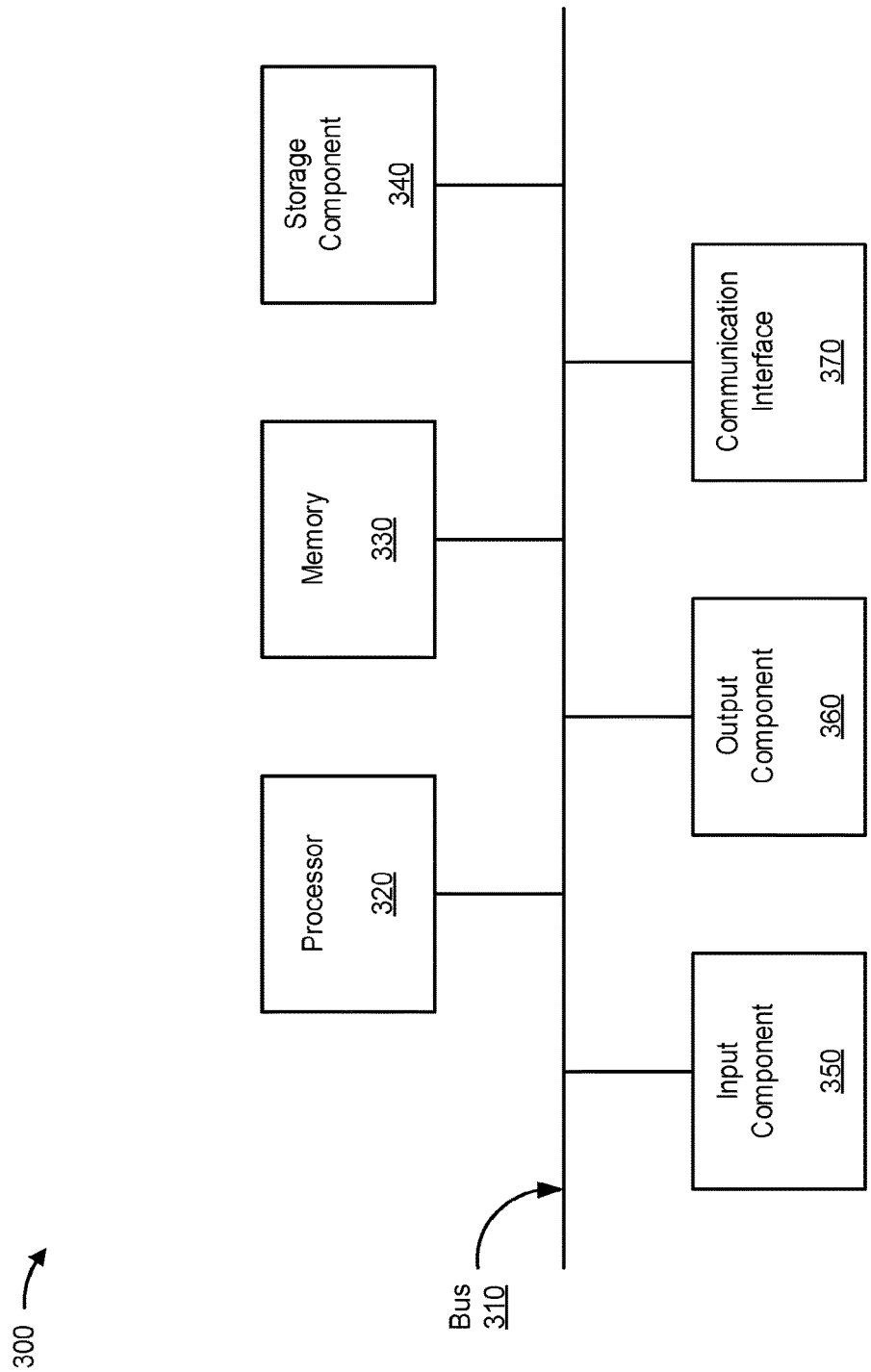
FIG. 3 is a diagram of example components of one or more devices of FIG. 2.

FIG. 3 is a diagram of example components of a device 300. Device 300 may correspond to semiconductor wafer sorter tool 105 and/or AOI tool 110. In some implementations, semiconductor wafer sorter tool 105 and/or AOI tool 110 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random-access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more LEDs).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, an RF interface, a universal serial bus (USB) interface, a wireless local area interface, a cellular network interface, and/or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flow chart of an example process 400 for detecting damaged semiconductor wafers utilizing an automated optical inspection with a semiconductor wafer sorter tool of automated materials handling system. In some implementations, one or more process blocks of FIG. 4 may be performed by a device (e.g., AOI tool 110). In some implementations, one or more process blocks of FIG. 4 may be performed by another device or a group of devices separate from or including the device, such a semiconductor wafer sorter tool (e.g., semiconductor wafer sorter tool 105). Additionally, or alternatively, one or more process blocks of FIG. 4 may be performed by one or more components of device 300, such as processor 320, memory 330, storage component 340, input component 350, output component 360, communication interface 370, and/or the like.

As shown in FIG. 4, process 400 may include detecting a semiconductor wafer to be transferred from a source wafer carrier to a target wafer carrier (block 410). For example, the device may detect a semiconductor wafer to be transferred from a source wafer carrier to a target wafer carrier, as described above.

As further shown in FIG. 4, process 400 may include causing a light source to illuminate the semiconductor wafer (block 420). For example, the device may cause a light source to illuminate the semiconductor wafer, as described above.

As further shown in FIG. 4, process 400 may include causing a camera to capture images of the semiconductor wafer after the light source illuminates the semiconductor wafer (block 430). For example, the device may cause a camera to capture images of the semiconductor wafer after the light source illuminates the semiconductor wafer, as described above.

As further shown in FIG. 4, process 400 may include performing image recognition of the images of the semiconductor wafer to determine whether an edge of the semiconductor wafer is damaged (block 440). For example, the device may perform image recognition of the images of the semiconductor wafer to determine whether an edge of the semiconductor wafer is damaged, as described above.

As further shown in FIG. 4, process 400 may include causing the semiconductor wafer to be selectively provided to the source wafer carrier or the target wafer carrier based on whether the edge of the semiconductor wafer is determined to be damaged, wherein the semiconductor wafer is to be provided to the source wafer carrier when the edge of the semiconductor wafer is determined to be damaged, and wherein the semiconductor wafer is to be provided to the target wafer carrier when the edge of the semiconductor wafer is determined to be undamaged (block 450). For example, the device may cause the semiconductor wafer to be selectively provided to the source wafer carrier or the target wafer carrier based on whether the edge of the semiconductor wafer is determined to be damaged, as described above. In some implementations, the semiconductor wafer is to be provided to the source wafer carrier when the edge of the semiconductor wafer is determined to be damaged. In some implementations, the semiconductor wafer is to be provided to the target wafer carrier when the edge of the semiconductor wafer is determined to be undamaged.

Process 400 may include additional implementations, such as any single implementation or any combination of implementations described below and/or in connection with one or more other processes described elsewhere herein.

In a first implementation, process 400 includes rotating the semiconductor wafer, and causing the camera to capture the images of the semiconductor wafer after the light source illuminates the semiconductor wafer include causing the camera to capture the images of the semiconductor wafer after the light source illuminates the semiconductor wafer and while the semiconductor wafer is rotating.

In a second implementation, alone or in combination with the first implementation, performing the image recognition of the images of the semiconductor wafer to determine whether the edge of the semiconductor wafer is damaged includes performing the image recognition of the images of the semiconductor wafer to determine whether the edge of the semiconductor wafer is damaged while the semiconductor wafer is being transported from the source wafer carrier; performing the image recognition of the images of the semiconductor wafer to determine whether the edge of the semiconductor wafer is damaged while the semiconductor wafer is being sorted; or performing the image recognition of the images of the semiconductor wafer to determine whether the edge of the semiconductor wafer is damaged while the semiconductor wafer is being rotated.

In a third implementation, alone or in combination with one or more of the first and second implementations, the light source includes a coaxial light source that provides a diffuse illumination of a sheet of light from a position above the semiconductor wafer.

In a fourth implementation, alone or in combination with one or more of the first through third implementations, the camera includes a high-speed camera that captures at least sixty frames of the images per second.

In a fifth implementation, alone or in combination with one or more of the first through fourth implementations, performing the image recognition of the images of the semiconductor wafer to determine whether the edge of the semiconductor wafer is damaged includes performing the image recognition of the images of the semiconductor wafer to determine, in near-real time, whether the edge of the semiconductor wafer is damaged.

In a sixth implementation, alone or in combination with one or more of the first through fifth implementations, performing the image recognition of the images of the semiconductor wafer to determine whether the edge of the semiconductor wafer is damaged includes determining that one or more portions of the edge of the semiconductor wafer are missing, and determining that the edge of the semiconductor wafer is damaged when a quantity of the one or more portions satisfies a threshold.

In a seventh implementation, alone or in combination with one or more of the first through sixth implementations, process 400 includes determining that one or more portions of the edge of the semiconductor wafer are missing; calculating one or more sizes associated with the one or more portions of the edge of the semiconductor wafer; and determining that the edge of the semiconductor wafer is damaged when at least one size, of the one or more sizes associated with the one or more portions, satisfies a threshold.

In an eighth implementation, alone or in combination with one or more of the first through seventh implementations, process 400 includes causing the source wafer carrier, with at least one damaged semiconductor wafer, to be provided for quality control inspection; and causing the target wafer carrier, with at least one undamaged semiconductor wafer, to be provided for further processing.

In a ninth implementation, alone or in combination with one or more of the first through eighth implementations, process 400 includes determining that one or more portions of the edge of the semiconductor wafer are missing; calculating one or more sizes associated with the one or more portions of the edge of the semiconductor wafer; and determining that the edge of the semiconductor wafer is damaged when a quantity of the one or more portions satisfies a first threshold or when at least one size, of the one or more sizes associated with the one or more portions, satisfies a second threshold.

In a tenth implementation, alone or in combination with one or more of the first through ninth implementations, the semiconductor wafer is a circular-shaped wafer and the edge of the semiconductor wafer is a perimeter of the circular-shaped wafer.

In an eleventh implementation, alone or in combination with one or more of the first through tenth implementations, process 400 includes providing the semiconductor wafer to one or more tools for further processing when the edge of the semiconductor wafer is undamaged; or providing at least one of the images of the semiconductor wafer for display when the edge of the semiconductor wafer is determined to be damaged.

In a twelfth implementation, alone or in combination with one or more of the first through eleventh implementations, the determination of whether the edge of the semiconductor wafer is damaged occurs less than three seconds after detecting the semiconductor wafer.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

In this way, AOI tool 110 may be utilized with semiconductor wafer sorter 105 of the automated materials handling system to automatically detect damaged semiconductor wafers while the semiconductor wafers are being handled by the system. For example, the AOI tool 110 may capture images of the semiconductor wafers and may perform image recognition of the captured images to identify damaged semiconductor wafers. Thus, AOI tool 110 may identify damaged semiconductor wafers prior to the semiconductor wafers being provided for shipping, may increase throughput of semiconductor wafer production, may conserve resources (e.g., human resources, tool resources, and/or manufacturing resources), and/or the like.

As described in greater detail above, some implementations described herein provide a method for detecting damaged semiconductor wafers. The method may include detecting a semiconductor wafer to be transferred from a source wafer carrier to a target wafer carrier, and causing a light source to illuminate the semiconductor wafer. The method may include causing a camera to capture images of the semiconductor wafer after the light source illuminates the semiconductor wafer, and performing image recognition of the images of the semiconductor wafer to determine whether an edge of the semiconductor wafer is damaged. The method may include causing the semiconductor wafer to be selectively provided to the source wafer carrier or the target wafer carrier based on whether the edge of the semiconductor wafer is determined to be damaged, where the semiconductor wafer is to be provided to the source wafer carrier when the edge of the semiconductor wafer is determined to be damaged, and where the semiconductor wafer is to be provided to the target wafer carrier when the edge of the semiconductor wafer is determined to be undamaged.

As described in greater detail above, some implementations described herein provide a device for detecting damaged semiconductor wafers. The device may include one or more memories and one or more processors to detect a semiconductor wafer to be transferred from a source wafer carrier to a target wafer carrier, and cause the semiconductor wafer to rotate with a sorter aligner component of the device. The one or more processors may cause a coaxial light source, of an automated optical inspection component of the device, to illuminate the semiconductor wafer, and may cause a high-speed camera, of the automated optical inspection component, to capture images of the semiconductor wafer after the coaxial light source illuminates the semiconductor wafer. The one or more processors may perform image recognition of the images of the semiconductor wafer to determine whether an edge of the semiconductor wafer is damaged, and may cause the semiconductor wafer to be selectively provided to the source wafer carrier or the target wafer carrier based on whether the edge of the semiconductor wafer is determined to be damaged. The semiconductor wafer may be provided to the source wafer carrier when the edge of the semiconductor wafer is determined to be damaged, and may be provided to the target wafer carrier when the edge of the semiconductor wafer is determined to be undamaged.

As described in greater detail above, some implementations described herein provide a non-transitory computer-readable medium for detecting damaged semiconductor wafers. The non-transitory computer-readable medium may store one or more instructions that, when executed by one or more processors of a semiconductor wafer sorter tool, may cause the one or more processors to receive a semiconductor wafer, and cause the semiconductor wafer to rotate with a sorter aligner component of the semiconductor wafer sorter tool. The one or more instructions may cause the one or more processors to cause a camera, of an automated optical inspection component of the semiconductor wafer sorter tool, to capture images of the semiconductor wafer, and perform, by the automated optical inspection component, image recognition of the images of the semiconductor wafer to determine whether an edge of the semiconductor wafer is damaged. The one or more instructions may cause the one or more processors to selectively provide the semiconductor wafer for quality control inspection when the edge of the semiconductor wafer is determined to be damaged, or provide the semiconductor wafer to one or more tools for further processing when the edge of the semiconductor wafer is determined to be undamaged.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A method, comprising:
    performing image recognition of an image of a semiconductor wafer to determine whether an edge of the semiconductor wafer is damaged;
    determining, based on the image recognition, that the edge of the semiconductor wafer is damaged based on:
        a quantity of one or more portions of the edge missing from the semiconductor wafer satisfying a threshold quantity, and
        a size of the one or more portions of the edge missing from the semiconductor wafer satisfying a threshold size; and
    causing the semiconductor wafer to be selectively provided to a first wafer carrier or a second wafer carrier based on whether the edge of the semiconductor wafer is determined to be damaged,
        wherein the semiconductor wafer is to be provided to the first wafer carrier when the edge of the semiconductor wafer is determined to be damaged, and
        wherein the semiconductor wafer is to be provided to the second wafer carrier when the edge of the semiconductor wafer is determined to be undamaged.

2. The method of claim 1, wherein the image recognition is performed while the semiconductor wafer is being at least one of transported, sorted, or rotated.

3. The method of claim 1, wherein the determining that the edge of the semiconductor wafer is damaged comprises:
    determining that the one or more portions are missing based on the image including one or more images that are darker in color than a color of the semiconductor wafer.

4. The method of claim 1, further comprising:
    providing identification data identifying the semiconductor wafer and damage data indicating whether the edge of the semiconductor wafer is damaged or undamaged.

5. The method of claim 4, further comprising:
capturing the identification data on a surface of the semiconductor wafer based on performing the image recognition.

6. The method of claim 1, wherein the image recognition is performed by processing the image with an image recognition model.

7. The method of claim 6, further comprising:
training the image recognition model with historical image data identifying semiconductor wafers with damaged edges and semiconductor wafers with undamaged edges.

8. A device, comprising:
one or more memories; and
one or more processors, coupled to the one or more memories, configured to:
perform image recognition of an image of a semiconductor wafer to determine whether an edge of the semiconductor wafer is damaged;
determine, based on the image recognition, that the edge of the semiconductor wafer is damaged based on:
a quantity of one or more portions of the edge missing from the semiconductor wafer satisfying a threshold quantity, and
a size of the one or more portions of the edge missing from the semiconductor wafer satisfying a threshold size; and
cause the semiconductor wafer to be selectively provided to a first wafer carrier or a second wafer carrier based on whether the edge of the semiconductor wafer is determined to be damaged,
wherein the semiconductor wafer is to be provided to the first wafer carrier when the edge of the semiconductor wafer is determined to be damaged, and
wherein the semiconductor wafer is to be provided to the second wafer carrier when the edge of the semiconductor wafer is determined to be undamaged.

9. The device of claim 8, wherein the one or more processors, to perform the image recognition, are configured to:
perform the image recognition while the semiconductor wafer is being at least one of transported, sorted, or rotated.

10. The device of claim 8, wherein the one or more processors, to determine that the edge of the semiconductor wafer is damaged, are configured to:
determine that the one or more portions are missing based on the image including one or more images that are darker in color than a color of the semiconductor wafer.

11. The device of claim 8, wherein the one or more processors are further configured to:
provide identification data identifying the semiconductor wafer and damage data indicating whether the edge of the semiconductor wafer is damaged or undamaged.

12. The device of claim 11, wherein the one or more processors are further configured to:
capture the identification data on a surface of the semiconductor wafer based on the image recognition.

13. The device of claim 8, wherein the one or more processors, to perform the image recognition, are configured to:
process the image with an image recognition model.

14. The device of claim 13, wherein the one or more processors are further configured to:
train the image recognition model with historical image data identifying semiconductor wafers with damaged edges and semiconductor wafers with undamaged edges.

15. A non-transitory computer-readable medium storing a set of instructions, the set of instructions comprising:
one or more instructions that, when executed by one or more processors of a device, cause the device to:
perform image recognition of an image of a semiconductor wafer to determine whether an edge of the semiconductor wafer is damaged;
determine, based on the image recognition, that the edge of the semiconductor wafer is damaged based on:
a quantity of one or more portions of the edge missing from the semiconductor wafer satisfying a threshold quantity, and
a size of the one or more portions of the edge missing from the semiconductor wafer satisfying a threshold size; and
cause the semiconductor wafer to be selectively provided to a first wafer carrier or a second wafer carrier based on whether the edge of the semiconductor wafer is determined to be damaged,
wherein the semiconductor wafer is to be provided to the first wafer carrier when the edge of the semiconductor wafer is determined to be damaged, and
wherein the semiconductor wafer is to be provided to the second wafer carrier when the edge of the semiconductor wafer is determined to be undamaged.

16. The non-transitory computer-readable medium of claim 15, wherein the one or more instructions, that cause the device to perform the image recognition, cause the device to:
perform the image recognition while the semiconductor wafer is being at least one of transported, sorted, or rotated.

17. The non-transitory computer-readable medium of claim 15, wherein the one or more instructions, that cause the device to determine that the edge of the semiconductor wafer is damaged, cause the device to:
determine that the one or more portions are missing based on the image including one or more images that are darker in color than a color of the semiconductor wafer.

18. The non-transitory computer-readable medium of claim 15, wherein the one or more instructions further cause the device to:
provide identification data identifying the semiconductor wafer and damage data indicating whether the edge of the semiconductor wafer is damaged or undamaged.

19. The non-transitory computer-readable medium of claim 18, wherein the one or more instructions further cause the device to:
capture the identification data on a surface of the semiconductor wafer based on the image recognition.

20. The non-transitory computer-readable medium of claim 15, wherein the one or more instructions, that cause the device to perform the image recognition, cause the device to:
process the image with an image recognition model,
wherein the image recognition model is trained with historical image data identifying semiconductor wafers with damaged edges and semiconductor wafers with undamaged edges.

* * * * *